United States Patent [19]

Gal et al.

[11] Patent Number: 4,839,541
[45] Date of Patent: Jun. 13, 1989

[54] SYNCHRONIZER HAVING DUAL FEEDBACK LOOPS FOR AVOIDING INTERMEDIATE VOLTAGE ERRORS

[75] Inventors: Laszlo V. Gal, Poway; Fernando W. Arraut; Christopher H. Khosravi, both of San Diego, all of Calif.

[73] Assignee: Unisys Corporation, Blue Bell, Pa.

[21] Appl. No.: 208,464

[22] Filed: Jun. 20, 1988

[51] Int. Cl.[4] .................. H03K 19/096; H03K 3/29; H03K 5/13; H03K 19/094
[52] U.S. Cl. .................. 307/481; 307/269; 307/279; 307/290; 307/451; 307/443; 328/63; 328/72
[58] Field of Search .............. 307/480, 481, 269, 279, 307/290, 291, 451, 443; 328/63, 72

[56] References Cited

U.S. PATENT DOCUMENTS

| | | | |
|---|---|---|---|
| 3,225,301 | 12/1965 | McCann | 307/269 |
| 3,471,790 | 10/1969 | Kaps | 328/72 |
| 3,612,906 | 10/1971 | Kennedy | 328/72 |
| 3,873,856 | 3/1975 | Gerlach et al. | 307/279 |
| 3,904,888 | 9/1975 | Griffin et al. | 307/279 |
| 3,953,744 | 4/1976 | Kawagoe | 307/269 |
| 3,983,496 | 9/1976 | Bedford et al. | 307/290 |
| 3,984,703 | 10/1976 | Jorgensen | 307/451 |
| 4,687,954 | 8/1987 | Yasuda et al. | 307/290 |

Primary Examiner—Stanley D. Miller
Assistant Examiner—Trong Quang Phan
Attorney, Agent, or Firm—Charles J. Fassbender; Kenneth L. Miller

[57] ABSTRACT

A synchronizer is comprised of a voltage amplifier having an input terminal for receiving a voltage sample and an output terminal for generating an output voltage that is inversely proportional to the voltage of the input terminal. Also, a first feedback circuit couples the output terminal to a control transistor internal to the amplifier, and a second feedback circuit couples the output terminal to the input terminal. The first feedback circuit together with the control transistor has a fast response time, in comparison to the second feedback circuit; and it operates to quickly increase the output voltage when the voltage sample on the input terminal is below a predetermined level, and vice versa, without altering the voltage sample on the input terminal. And, the second feedback circuit operates to slowly modify the voltage sample on the input terminal in inverse proportion to the output terminal voltage.

10 Claims, 8 Drawing Sheets

Fig. 5 eq.1  $\quad g_N v_3 = i_{3a} = C_{3a} \dfrac{dv_{3a}}{dt}$ eq.2  $\quad g_N v_{3a} = i_3 = C_3 \dfrac{dv_3}{dt}$ eq.3  $\quad v_3 = K_1 e^{\frac{t}{T_1}}$ where $T_1 = \sqrt{\dfrac{C_3 C_{3a}}{g_N^2}}$ eq.4  $\quad C_3 = 2C_j + C_g$ eq.5  $\quad C_g \cong 3C_j , \therefore C_3 \cong 5C_j$ eq.6  $\quad C_{3a} = 3C_j$ eq.7  $\quad T_1 = \dfrac{\sqrt{5C_j \cdot 3C_j}}{g_N} = 3.87 \dfrac{C_j}{g_N}$

Fig. 7 eq.10 $\quad (g_N + g_p) v_2 = i'_3 = C'_2 \dfrac{dv_3}{dt}$ eq.11 $\quad (g_N + g_p) v_3 = i_2 = C_2 \dfrac{dv_2}{dt}$ eq.12 $\quad v_3 = K_2 e^{\frac{t}{T_2}}$ where $T_2 = \sqrt{\dfrac{C_2 C'}{(g_N + g_p)^2}}$ eq.13 $\quad g_N \cong 2 g_p$ eq.14 $\quad C' = 3C_g + 2C_j \cong 9C_j + 2C_g = 11C_j$ eq.15 $\quad C_2 = 3C_g + 2C_j \cong 11C_j$ eq.16 $\quad T_2 = \dfrac{11 C_j}{1.5 g_N} = 7.33 \dfrac{C_j}{g_N}$ eq.17 $\quad T_2 = \dfrac{7.33}{3.87} T_1 = 1.89 T_1$

Fig. 9 eq. 20 $\quad MTBF = \dfrac{e^{\frac{T}{\tau_S}}}{f_{CK1}\, f_{in}\, \Delta}$ eq. 21 $\quad f_{CK1} = f_{in} = 10\,MH_3,\ \Delta = 1ns,\ T = 30ns$ eq. 22 $\quad MTBF = \dfrac{e^{\frac{30NS}{\tau_S}}}{10^5}$ eq. 23 $\quad \tau_S < \tau_1 < \tau_2$ eq. 24 $\quad MTBF = \dfrac{e^{\frac{30NS}{\tau_1}}}{10^5} \quad \text{where } \tau_1 = 3.87\,\dfrac{C_j}{g_N}$ eq. 25 $\quad g_N = 10^{-4}\,\dfrac{AMP}{VOLT},\ C_j = 0.02\,pf$ eq. 26 $\quad MTBF \cong \dfrac{e^{\frac{30(10^{-9})(10^{-4})}{3.87(0.02)(10^{-12})}}}{10^5} = \dfrac{e^{38.7}}{10^5} \cong 20{,}341\,yrs$

Fig. 10 eq. 30  $C' = 2C_g + 2C_j \cong 8C_j$ eq. 31  $C_2 = C'$ eq. 32  $T_I = \sqrt{\dfrac{C_2 C'}{(g_N + g_p)^2}} = 5.33 \dfrac{C_j}{g_N}$ eq. 33  $MTBF = \dfrac{e^{\frac{30NS}{T_I}}}{10^5}$  where  $T_I = 5.33 \dfrac{C_j}{g_N}$ eq. 34  $MTBF = \dfrac{e^{\frac{30(10^{-9})(10^{-4})}{5.33(0.02)(10^{-12})}}}{10^5} = \dfrac{e^{28.1}}{10^5} \cong 0.506$

SYNCHRONIZER HAVING DUAL FEEDBACK LOOPS FOR AVOIDING INTERMEDIATE VOLTAGE ERRORS

BACKGROUND OF THE INVENTION

This invention relates to synchronizing circuits; and more particularly, it relates to synchronizers which sample an asynchronous digital input signal with a clock and operate with low error rates.

Synchronizers, of the type with which the present invention is concerned, have use whenever digital information is to be transferred between two digital modules that operate asynchronously to one another. For example, digital computers usually have their own internal clock to which their internal operations are synchronized; and thus, when one computer sends information to a second computer, the information will arrive at the second computer asynchronously with respect to its internal clock. Similarly, when information is entered by an operator via a keyboard into a computer, the keys are pressed asynchronously with respect to the computer's internal clock.

In the above cases, a synchronizer circuit is often used to sample and hold the incoming data until it can be received by the receiving computer. However, since the incoming data is asynchronous, there is a certain probability that the data will change at the same time that it is being sampled. And, when that happens, the sample that is taken may be at an intermediate voltage level which lies between a full "1" and a full "0".

Then, if the intermediate voltage is operated on by the receiving computer, an error can occur. This is because the intermediate voltage can be interpreted by the computer as a "1" when it actually was a "0", and vice versa. Consequently, it is important that the synchronizer circuit be designed to reduce the probability with which such intermediate voltage errors occur.

One synchronizer circuit of the prior art which is related to the present invention is described in U.S. Pat. No. 3,953,744 which issued in 1976 to Kawagoe. However, with the '744 synchronizer, the probability of an intermediate voltage error occurring is too high; and this will be explained in detail in the Detailed Description in conjunction with FIG. 10.

Accordingly, it is a primary object of the invention to provide an improved synchronizing circuit which greatly reduces intermediate voltage errors.

BRIEF SUMMARY OF THE INVENTION

This object and others are achieved by a synchronizer which is comprised of a voltage amplifier having an input terminal for receiving a voltage sample of the signal that is to be synchronized, and having an output terminal for generating an output voltage that is inversely proportional to the voltage on the input terminal. Also, two feedback circuits are coupled to the amplifier's output terminal. One of these feedback circuits (the first one) couples the amplifier's output terminal to a control node that is internal to the amplifier, and the second feedback circuit couples the output terminal back to the input terminal. Also, the first feedback circuit has a fast response time in comparison to the second feedback circuit. This first feedback circuit operates to quickly increase the output voltage of the amplifier when the voltage sample on the input terminal is below a predetermined level, and vice versa, without altering the magnitude of the voltage sample. By comparison, the slower second feedback circuit operates to modify the voltage sample on the input terminal in inverse proportion to the output terminal voltage. Through the combined action of these two feedback circuits, intermediate voltage errors are reduced to a rate of less than one in twenty thousand years.

BRIEF DESCRIPTION OF THE DRAWINGS

Various features and advantages of the invention are described herein in conjunction with the accompanying drawings wherein:

FIG. 5 is a set of equations which describe the transient operation of the FIG. 4 circuit;

FIG. 7 is a set of equations which describes the transient operation of the FIG. 6 circuit;

FIG. 9 is a set of equations which calculate the MTBF of the FIG. 3 circuit;

FIG. 10 is a set of equations which calculate the MTBF of a prior art circuit,

DETAILED DESCRIPTION OF THE INVENTION

Figure 1:
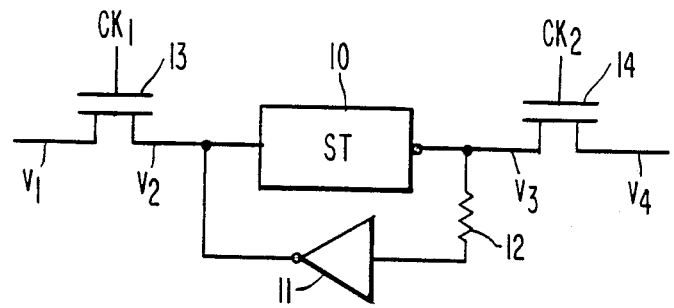
FIG. 1 illustrates a preferred embodiment of the invention.

Referring now to FIG. 1, the details of a preferred embodiment of the invention will be described. This embodiment includes a Schmitt trigger 10, an inverter 11, and a resistor 12. All of these components are interconnected in a loop as illustrated. Also included is a transistor 13 which is coupled to the input terminal of the schmitt trigger 10, and a transistor 14 which is coupled to the output terminal of the Schmitt trigger 10.

In operation, a digital input voltage $v_1$ which is to be synchronized is applied to the source of transistor 13, and a digital clock $CK_1$ is applied to the gate of transistor 13. When clock $CK_1$ is high, a sample of the voltage $v_1$ is transferred to the input terminal of the Schmitt trigger 10. This sample is indicated as voltage $v_2$. Then, components 10, 11, and 12 operate on the voltage $v_2$ to produce a voltage $v_3$ on the output terminal of the schmitt trigger. Thereafter, a digital clock $CK_2$ is applied to the gate of transistor 14 to transfer the voltage $v_3$ to the drain of transistor 14 as a voltage $v_4$.

Figure 2:
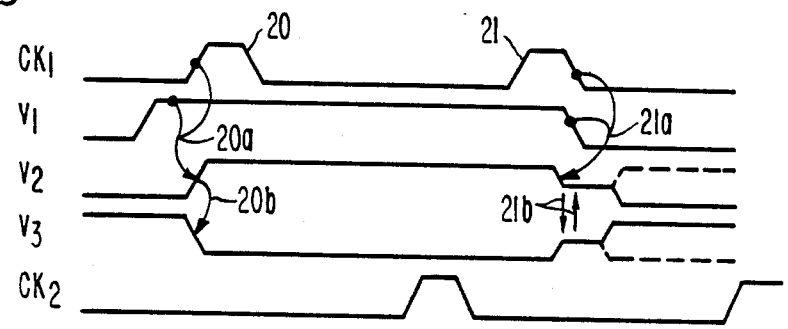
FIG. 2 illustrates the overall operation of the FIG. 1 embodiment.

Now in the above-described operation, the voltage $v_1$ can change at any time with respect to the clock signal $CK_1$. This is illustrated in FIG. 2. There, voltage $v_1$ changes before the first clock pulse 20 and remains stable during the clock pulse; whereas during the second clock pulse 21, the voltage $v_1$ changes state. When voltage $v_1$ stays stable during a $CK_1$ clock pulse, the other voltages $v_2$ and $v_3$ stabilize shortly after the rising edge of the $CK_1$ clock. This is indicated by the transitions 20a and 20b in FIG. 2. But when voltage $v_1$ changes state during a $CK_1$ clock pulse, then the voltages $v_2$ and $v_3$ take a longer time to stabilize, as is indicated by the transitions 21a and 21b in FIG. 2.

In the worst case, the voltage $v_1$ *changes just before the clock* $CK_1$ goes low. Suppose, for example, that a full "1" voltage is five volts and a full "0" voltage is zero volts; and suppose further that voltage $v_1$ changes just before clock $CK_1$ goes low. In that case, the voltage sample $v_2$ can have any magnitude between zero and five volts. This intermediate voltage is then operated on by components 10, 11 and 12 to produce voltage $v_3$ as a full "1" voltage and regenerate the voltage $v_2$ as a full "0" voltage; or vice versa.

To further explain the above regenerative process, the detailed transistor makeup of one preferred version of the components 10 and 11 will now be described in conjunction with FIG. 3. There, the schmitt trigger 10 consists of one P channel transistor 10a and three N channel transistors 10b, 10c, and 10d. Also the inverter 11 consists of one P channel transistor 11a and one N channel transistor 11b. All of these transistors, together with resistor 12, are interconnected as illustrated.

Figure 3:
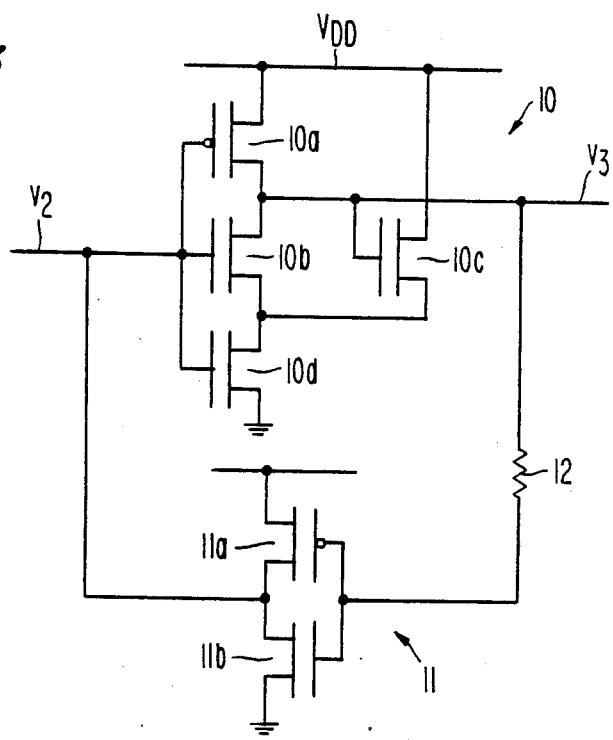
FIG. 3 is a detailed circuit diagram of one version of the FIG. 1 embodiment.

Inspection of the FIG. 3 circuit shows that it contains two separate feedback loops. One feedback loop includes resistor 12 together with transistors 11a and 11b; and they are coupled as shown from the output terminal of, the Schmitt trigger 10 to the input terminal of the Schmitt trigger. In operation, this feedback functions to slowly regenerate the voltage $v_2$ on the input terminal of the Schmitt trigger 10 in inverse proportion to the voltage $v_3$. This prevents the $v_2$ voltage sample which transistor 13 provides from dissipating due to leakage.

By comparison, the other feedback loop includes transistors 10c and 10d; and they are coupled as shown from the output terminal of the Schmitt trigger 10 to the drain of transistor 10b. In operation, this feedback functions to quickly increase the voltage $v_3$ when the voltage sample $v_2$ is below a certain predetermined level, and vice versa, without altering the magnitude of the voltage sample $v_2$ on the input terminal.

For example, suppose that the voltage sample $v_2$ is at an intermediate low voltage which is near the midpoint between a full "0" voltage and the full "1" voltage. In that case, transistors 10a, 10b, and 10d will all be conducting about the same current; and transistor 10c will just be starting to turn on. As transistor 10c starts to conduct, the voltage across it will drop; and consequently, the source to drain voltage across transistor 10d will increase. That in turn will lower the gate to source voltage of transistor 10b, and thus transistor 10b will conduct less. Lowering the conductance of transistor 10b will raise the voltage $v_3$, which in turn will cause transistor 10c to conduct more; etc. Thus, by repeating this feedback action, transistor 10b will turn off and voltage $v_3$ will reach a full "1" level.

Figure 4:
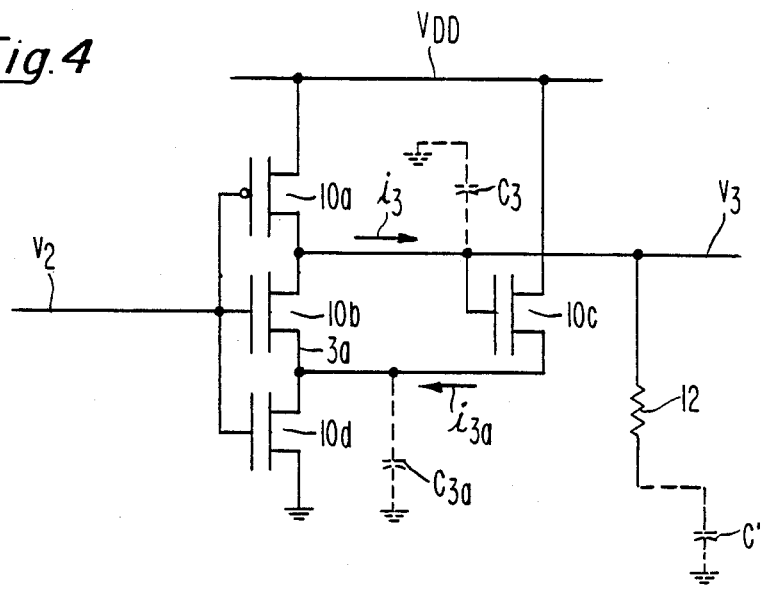
FIG. 4 is a modification of the FIG. 3 circuit that is used to analyze one of the feedback loops in the FIG. 3 circuit.

An analytical expression for the speed with which the above feedback action occurs will now be derived in conjunction with FIGS. 4 and 5. FIG. 4 is a modified version of FIG. 3 in which the transistors 11a and 11b are deleted, and certain parasitic capacitors C3, C3a, and C' are added. Deletion of the transistors 11a and 11b enables the speed of the transistor 10c feedback to be analyzed separately from the other feedback. Also, the parasitic capacitors are added since they are inherently present at the input of a transistor's gate and the output of a transistor's source and drain.

Inspection of FIG. 4 shows that a current $i_3$ through transistor 10a will charge the parasitic capacitor C3 and thereby raise voltage $v_3$. Similarly, a current $i_{3a}$ through transistor 10c will charge the parasitic capacitor C3a and thereby raise the voltage $v_{3a}$ across transistor 10d. This charging action is stated mathematically in FIG. 5 by the differential equations 1 and 2. There, symbol $g_N$ represents the transconductance of an N channel transistor when its gate voltage is midway between a full "1" voltage and a full "0" voltage.

Equations 1 and 2 may be solved by various techniques, such as by Laplace transforms; and their solution yields equation 3. It states that when the voltage $v_2$ is near the midpoint between a full "1" voltage and a full "0" voltage, the voltage $v_3$ will vary due to the transistor 10c feedback as an exponential. This exponential has a time constant $\tau_1$, where $\tau_1$ is a function of the parasitic capacitors C3 and C3a, and the transconductance $g_N$.

Capacitor C3 is the capacitor which current $i_3$ must charge in order to raise the voltage $v_3$. Inspection of FIG. 4 shows that capacitor C3 is equal to the output junction capacitance of two transistors (transistors 10a and 10b) and the gate capacitance of one transistor (transistor 10c). This is stated by equation 4. Typically, the gate capacitance of a transistor is about three times the transistor's output junction capacitance, and thus equation 4 can be rewritten as equation 5. Similarly, inspection of FIG. 4 shows that the capacitor C3a is equal to the output junction capacitance of three transistors (transistors 10b, 10c and 10d). This is stated by equation 6. Substitution of equations 5 and 6 into equation 3 yields the equation 7 expression for the time constant $\tau_1$.

It should be pointed out that in the above analysis, the parasitic capacitor C' (which equals the gate capacitance of the transistors 11a and 11b) is ignored. That, however, does not make the analysis inaccurate because capacitor C' together with resistor 12 form a low pass filter. Consequently, the voltage $v_3$ can quickly vary without having to change the voltage across capacitor C'.

Figure 6:
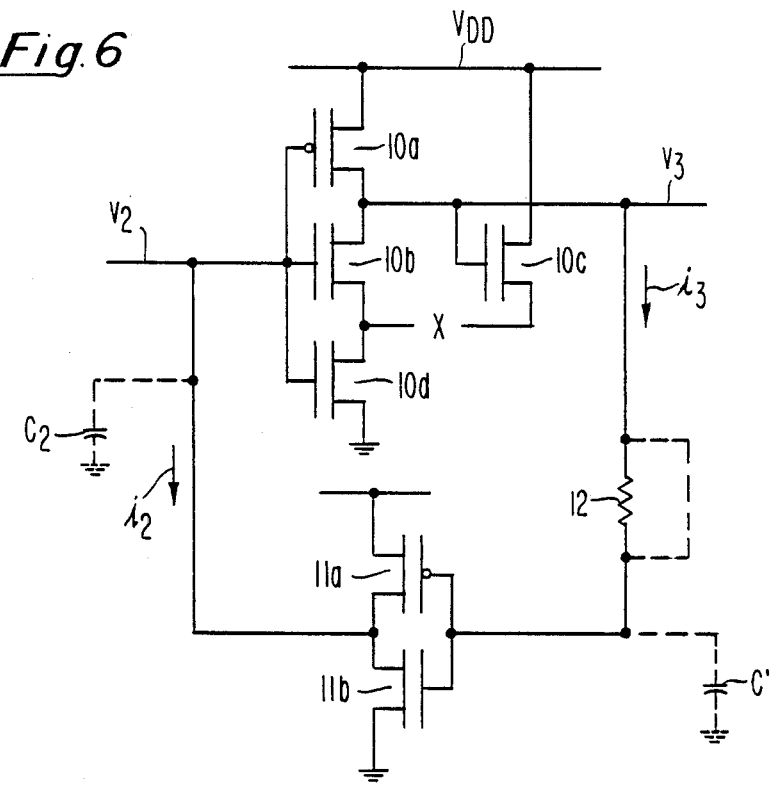
FIG. 6 is a modification of the FIG. 3 circuit which is used to analyze a second feedback loop in the FIG. 3 circuit.

Turning now to FIGS. 6 and 7, the speed by which the second feedback loop operates in the FIG. 3 circuit will be analyzed. FIG. 6 is a modification of the FIG. 3 circuit in which the feedback through transistor 10c is disconnected. This allows the operation of the feedback through transistors 11a and 11b to be analyzed independent of the feedback which transistor 10c provides. Also in FIG. 6, resistor 12 is short-circuited. This is done to simplify the analysis. Shorting resistor 12 will produce a faster response time; however, even this faster response will be slower than the response of the FIG. 4 loop. Further in FIG. 6, parasitic capacitors C2 and C' are added.

Inspection of FIG. 6 shows that a current $i_3'$ through transistor 10a charges the parasitic capacitor C' in order to raise the voltage $v_3$. Similarly, a current $i_2$ through transistor 11b discharges capacitor C2 in order to lower the voltage $v_2$. This is stated mathematically in FIG. 7 by equations 10 and 11. There, $g_N$ is the transconductance of an N channel transistor and $g_P$ is the transconductance of a P channel transistor when its gate voltage is midway between a full "1" voltage and a full "0" voltage.

Solving equations 10 and 11 yields equation 12. It states that when a voltage sample $v_2$, which is near the midpoint between a full "1" voltage and a full "0" voltage, is placed on the capacitor C2, the output voltage $v_3$ will change as an exponential due to the feedback that occurs through the transistors 11a and 11b. And, that exponential has a time constant $\tau_2$ which is a function of C2, C', $g_N$ and $g_P$.

Time constant $\tau_2$ can be simplified by utilizing equations 13, 14 and 15. Equation 13 states that the transconductance of an N channel transistor is approximately twice the transconductance of a P channel transistor. Equation 14 states that the parasitic capacitor C' is equal to the gate capacitance of three transistors (transistors 10c, 11a, and 11b) plus the output junction capacitance of two transistors (transistors 10a and 10b). Similarly, equation 15 states that the parasitic capacitor C2 is equal to the gate capacitance of three transistors (transistors 10a, 10b, and 10d) and the output junction capacitance of two transistors (transistors 11a and 11b).

Substitution of equations 13, 14, and 15 into equation 12 yields equation 16. It gives an expression for the time constant $\tau_2$ in terms of the junction capacitance and N channel transconductance. Comparison of equation 16 with equation 7 yields equation 17, which shows that the time constant $\tau_2$ is much larger than the time constant $\tau_1$. This result is illustrated graphically in FIG. 8. There, a curve 31 shows the transient response of the feedback loop which passes through transistor 10c; and a curve 32 shows the transient response of the feedback loop which passes through transistors 11a and 11b.

Of primary importance in the disclosed synchronizer circuit is the speed with which voltage $v_3$ changes. In particular, in order to reduce logic errors in external circuitry which uses the synchronizer, it is critical that the voltage $v_3$ does not stay very long at any intermediate voltage which lies between the "0" and "1" voltage levels. By comparison, the time that is spent by the voltage $v_2$ between the "0" voltage level and the "1" voltage level is relatively unimportant since that voltage does not go to any external circuitry.

An equation which mathematically relates the time constant $\tau_s$ of any synchronizer to its MTBF (mean time between failure) is given as equation 20 in FIG. 9. This equation is derived at pages 361-363 of the book entitled *The Design and Analysis of VLSI Circuits* by Glasser et al which is published by Addison-Wesley, 1985. In equation 20, $f_{CK1}$ is the frequency of clock $CK_1$; fin is the frequency of transitions in the signal $v_1$; $\Delta$ is the time which it takes the input signal to make a transition through the intermediate voltages that lie between a "0" and a "1"; T is the time delay that occurs between the placing of a voltage sample on the input terminal of the synchronizer and the use by external circuitry of the synchronizer output voltage; and $\tau_s$ is the time constant of the synchronizer.

Suppose, for example, that $f_{CK1}=10$ MHz, $f_{in}=10$ MHz, $\Delta=1$ nanosecond, and T=30 nanoseconds. This is stated by equation 21. Then, substituting equation 21 into equation 20 yields equation 22. There, the only parameter that remains is the synchronizer time constant $\tau_s$.

In the disclosed synchronizer, the two feedback loops of FIGS. 4 and 6 operate in parallel. Consequently, the time constant of the disclosed synchronizer as a whole will be less than each of the individual time constants $\tau_1$ and $\tau_2$. This is stated by equation 23. However, to simplify the analysis, assume that the combined time constant merely equals $\tau_1$. Then, substituting $\tau_1$ into equation 22 yields equation 24.

Assume now some reasonable values for the parameters $g_N$ and $C_j$ in equation 24. Such values are given by equation 25. They are representative of a transistor having a one micron gate length and a sixteen micron gate width. Substituting equation 25 into equation 24 yields equation 26, which states that the MTBF for the disclosed synchronizer is over 20,000 years!

By comparison, consider now the MTBF which will result from the Glasser et al synchronizer which consists of two inverting logic gates that have their respective output terminals and input terminals connected together in a loop. Such a synchronizer can be analyzed by referring back to FIG. 6 and there eliminating transistors 10c and 10d, and grounding the drain of transistor 10b.

With those modifications, all of the analysis of equations 10, 11, 12, and 13 still applies. But, the capacitor C' would now be expressed as equation 30 in FIG. 10; and the capacitor C2 would be expressed as equation 31. In equation 30, the two gate capacitances are due to transistors 11a and 11b, and the two junction capacitors are due to transistors 10a and 10b. Substituting equations 30 and 31, as well as equation 13, into equation 12, yields equation 32.

Next, equation 32 can be substituted into equation 22 to thereby obtain an expression for the MTBF of the synchronizer which consists of two inverters. This result is given by equation 33. Then, the previous values of $g_N$ and $c_j$ as given by equation 25 can be substituted into equation 33. This yields equation 34, which states that the MTBF of the two-inverter synchronizer is only about 0.5 year!

As a further comparison, consider the synchronizer which is described in U.S. Pat. No. 3,953,744. It includes two inverting logic gates that have their respective output terminals and input terminals connected together in a loop (just like the Glasser et al synchronizer); and in addition, a Schmitt trigger is included which passes the input signal that is to be synchronized to the two inverting logic gates. This is shown in FIG. 1 of patent '744.

Figure 8:
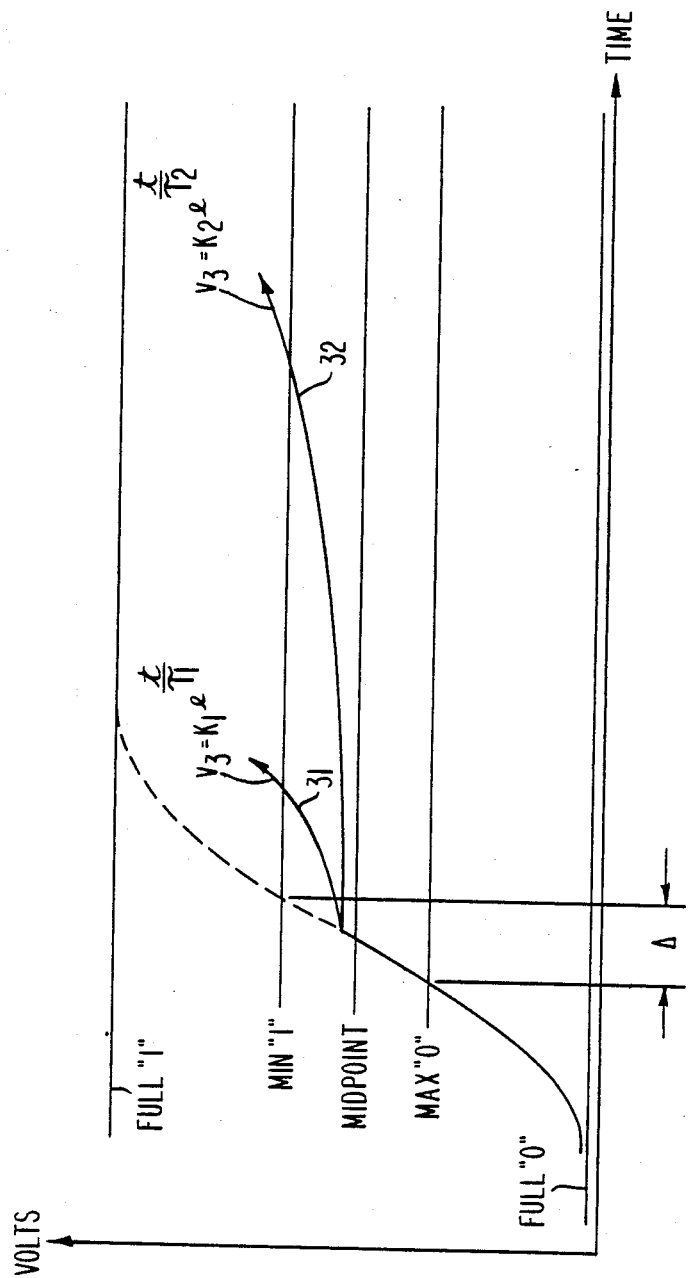
FIG. 8 illustrates the transient response of both feedback loops in the FIG. 3 circuit.

Now in the '744 synchronizer, the only effect of the Schmitt trigger is to shorten the rise and fall times of the signals that are sent to the cross-coupled logic gates. In other words, the Schmitt trigger merely decreases the term $\Delta$ that is shown in FIG. 8 and is part of equation 20 in FIG. 9. The '744 Schmitt trigger does not, and cannot, affect the time constant of the cross-coupled logic gates since it is outside of the loop which they form.

In the above analysis of the disclosed synchronizer, and the Glasser et al synchronizer, $\Delta$ was assumed to equal one nanosecond (see equation 21). Feeding a signal with a one nanosecond rise and fall time into a Schmitt trigger would produce an output signal whose rise and fall time is decreased at the very most by a factor of about ten to 0.1 nanoseconds. Thus, the MTBF of the '744 synchronizer would merely be increased by the same factor of ten, to 5.0 years.

Figure 11:
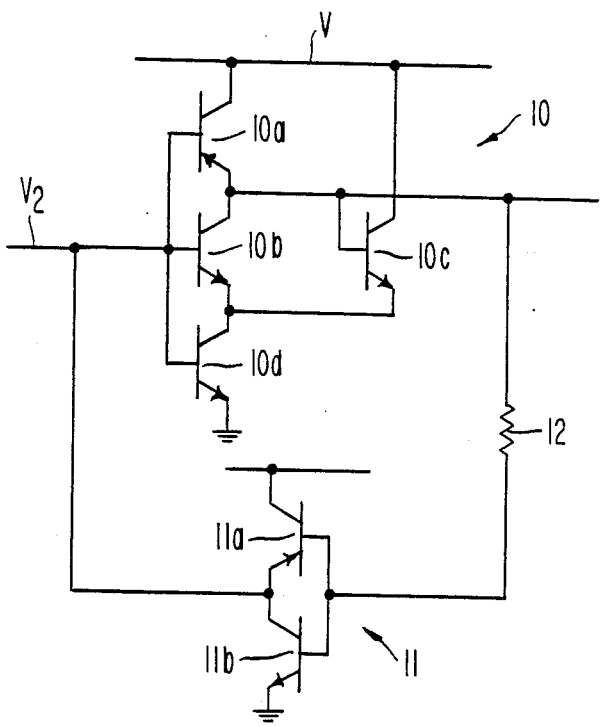
FIG. 11 is an alternative embodiment, that is similar to the FIG. 3 embodiment, in which all of the transistors are bipolar.

A preferred embodiment of the invention has now been described in detail. In addition, however, many changes and modifications can be made to these details without departing from the nature and spirit of the invention. For example, in the embodiment of FIG. 3, the Schmitt trigger 10 and inverter 11 are made of CMOS transistors. But as an alternative, the Schmitt trigger 10 and inverter 11 can also be made of bipolar transistors as shown, for example, in FIG. 11 wherein the transistor reference numerals correspond to those of FIG. 2, or entirely of N channel transistors.

Figure 12:
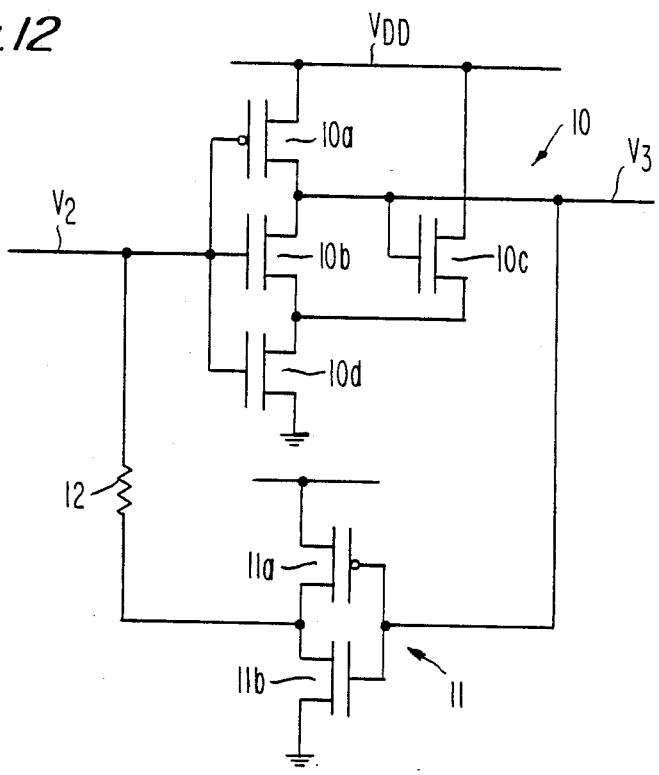
FIG. 12 is an alternative embodiment, that is similar to the FIG. 3 embodiment, in which the location of a resistor is changed.

Also in the FIG. 3 embodiment, the particular circuit arrangement for the two feedback loops can be modified. FIG. 12, for example, shows a modification of the FIG. 3 embodiment in which the location of resistor 12 is changed. In general, all that is required is that the first feedback loop operates to quickly increase the output voltage $v_3$ when the voltage sample $v_2$ is below a predetermined level, and vice versa, without altering the voltage sample $v_2$; and that the second feedback loop operates slowly to modify the voltage sample $v_2$ in inverse proportion to the output terminal voltage. Preferably, both of the feedback loops respond exponentially to a voltage sample on the input terminal with the time constant of the first feedback loop response being at least twenty percent smaller than the time constant of the second feedback loop. Also preferably, this difference in the time constants is achieved by making the capacitance of the first feedback loop substantially smaller than the capacitance of the second feedback loop.

Accordingly, it is to be understood that the invention is not limited to the above details but is defined by the appended claims.

What is claimed is:

1. A circuit, for synchronizing a digital input signal with a clock where said digital input signal changes asynchronously with respect to said clock, said circuit being comprised of:
   a Schmitt trigger in combination with an inverter;
   said Schmitt trigger having an output terminal which is coupled through a resistor to an input terminal on said inverter, and said inverter having an output terminal which is coupled directly to an input terminal on said Schmitt trigger; and
   a transistor means, having an output terminal which is coupled to said input terminal of said Schmitt trigger and having two input terminals that respectively receive said clock and said input signal, for passing a sample of said input signal in response to said clock to said Schmitt trigger input terminal;
   wherein said Schmitt trigger together with said inverter operate on said sample to produce a signal on said Schmitt trigger output terminal, which represents said input signal and is synchronized with said clock.

2. A synchronizer which is comprised of:
   a Schmitt trigger having an input terminal and an output terminal;
   a sampling means, coupled to said input terminal, that simultaneously receives a clock and an input signal, for passing a sample of said input signal to said input terminal in response to said clock;
   a logic gate coupled as an external feedback path from said output terminal to said input terminal; and
   said Schmitt trigger including an internal feedback means that is coupled from said output terminal to a node within said Schmitt trigger, for switching voltages on said output terminal, in response to said input signal sample, faster than said external feedback.

3. A synchronizer according to claim 2 wherein said Schmitt trigger output terminal is coupled to an input terminal on said logic gate through a resistor.

4. A synchronizer according to claim 2 wherein an output on said logic gate is coupled to said Schmitt trigger input terminal through a resistor.

5. A synchronizer which is comprised of:
   a voltage amplifier means having an input terminal for receiving a voltage sample, and having an output terminal for generating an output voltage that is inversely proportional to the voltage on said input terminal;
   a first feedback means coupling said output terminal to a control means internal to said amplifier such that said first feedback means and said control means together form a first complete loop, and a second feedback means coupling said output terminal to said input terminal to form a second complete loop;
   said first feedback means together with said control means having a fast response time, in comparison to said second feedback means, and operating to quickly increase said output voltage when said sample is below a predetermined level, and vice versa, without altering said voltage sample on said input terminal; and
   said second feedback means operating to slowly modify said voltage sample on said input terminal in inverse proportion to said output terminal voltage.

6. A synchronizer according to claim 5 wherein said first feedback means together with said amplifier has a response to a voltage sample near said predetermined level of the form $K_1 EXP$, and said second feedback means together with said amplifier has a response of the form $K_2 EXP$ were $K_1$, $K_2$, $\tau 1$ and $\tau 2$ are constants, and $\tau 1$ is at least 20% smaller than $\tau 2$.

7. A synchronizer according to claim 5 wherein said control means includes a field effect transistor with a gate that is coupled to receive said voltage sample on said input terminal as well as a feedback voltage from said second feedback means, and with a drain that is coupled to receive another feedback voltage from said first feedback means.

8. A synchronizer according to claim 5 wherein said control means includes a bipolar transistor with a base that is coupled to receive said voltage sample on said input terminal as well as a feedback voltage from said second feedback means, and with an emitter that is coupled to receive another feedback voltage from said first feedback means.

9. A synchronizer according to claim 5 wherein said first feedback means together with said amplifier form a regenerative loop with a low capacitance, and said second feedback means together with said amplifier form another regenerative loop with a high capacitance.

10. A synchronizer according to claim 5 wherein said amplifier together with said first feedback means comprises a Schmitt trigger.

* * * * *